(12) United States Patent
Kim et al.

(10) Patent No.: US 8,043,716 B2
(45) Date of Patent: Oct. 25, 2011

(54) GRADIENT THIN FILM

(75) Inventors: Ho Sup Kim, Gimhae-si (KR); Sang Soo Oh, Changwon-si (KR); Tae Hyung Kim, Daegu (KR); Dong Woo Ha, Changwon-si (KR); Kyu Jung Song, Changwon-si (KR); Hong Soo Ha, Changwon-si (KR); Rock Kil Ko, Gimhae-si (KR); Nam Jin Lee, Sacheon-si (KR)

(73) Assignee: Korea Electrotechnology Research Institute (KR)

( * ) Notice: Subject to any disclaimer, the term of this patent is extended or adjusted under 35 U.S.C. 154(b) by 543 days.

(21) Appl. No.: 12/177,865

(22) Filed: Jul. 22, 2008

(65) Prior Publication Data

US 2009/0110952 A1 Apr. 30, 2009

(30) Foreign Application Priority Data

Oct. 29, 2007 (KR) .................. 10-2007-0108749

(51) Int. Cl.
*H01L 39/12* (2006.01)
*H01L 39/24* (2006.01)
*H01B 12/02* (2006.01)
*B05D 5/12* (2006.01)

(52) U.S. Cl. ........ 428/610; 428/701; 428/702; 428/547; 428/548; 505/191; 505/230; 505/238; 505/473; 505/701; 427/62; 427/255.19; 252/520.21; 423/594.12

(58) Field of Classification Search .............. 428/610, 428/694 GR, 698–702, 547, 548; 505/191, 505/230, 234–239, 470–477, 701, 704; 427/62, 427/255.19; 252/520.21
See application file for complete search history.

(56) References Cited

U.S. PATENT DOCUMENTS 6,258,459 B1 * 7/2001 Noguchi et al. .............. 428/446

FOREIGN PATENT DOCUMENTS

| JP | 01-129962 A | 5/1989 |
| JP | 04-218660 A | 8/1992 |
| JP | 06-212410 A | 8/1994 |
| KR | 100795063 B1 | 1/2008 |

* cited by examiner

*Primary Examiner* — Stanley Silverman
*Assistant Examiner* — Kallambella Vijayakumar
(74) *Attorney, Agent, or Firm* — Park & Associates IP Law, P.C.

(57) ABSTRACT

Disclosed herein is a gradient thin film, formed on a substrate by simultaneously depositing different materials on the substrate using a plurality of thin film deposition apparatuses provided in a vacuum chamber, wherein the gradient thin film is formed such that the composition thereof is continuously changed depending on the thickness thereof by deposition control plates provided in the path through which the different materials move to the substrate. The gradient thin film is advantageous in that the thin film is formed by simultaneously depositing different materials using various deposition apparatuses, so that the composition thereof is continuously changed depending on the thickness thereof, with the result that the physical properties of a thin film are easily controlled and the number of deposition processes is decreased, and thus processing time and manufacturing costs are decreased, thereby improving economic efficiency.

2 Claims, 6 Drawing Sheets

YSZ XRD-RMS

YZO XRD-RMS

YBCO/YZO/NiW θ-2θ XRD

GRADIENT THIN FILM

FIELD OF THE INVENTION

The present invention relates to a gradient thin film, and, particularly, to a gradient thin film in which the thin film is formed by simultaneously depositing different materials, and thus its composition is continuously changed depending on the thickness thereof. More particularly, the present invention relates to a gradient thin film constituting a buffer layer of a superconducting sheet.

BACKGROUND OF THE INVENTION

In various conventional thin film deposition methods, a method of depositing a buffer layer of a superconducting sheet is performed through a sputtering process, an evaporation process or an electron beam deposition process. However, such a method of depositing a buffer layer of a superconducting sheet is problematic in that processes of depositing a thin film must be repeatedly conducted in order to form a multi-layered thin film, and thus additional costs for establishing a system for conducting the processes and maintaining the system are incurred, and it is difficult to decrease the manufacturing time of a superconducting sheet and to secure economic efficiency because the number of the processes for depositing a thin film is increased.

For instance, a REBCO (for example, YBCO, SmBCO, GdBCO or NdBCO) based superconducting sheet, which is a typical second-generation superconducting sheet, must have a multi-layered buffer thin film (for example, $Y_2O_3$/YSZ/$CeO_2$, $CeO_2$/YSZ/$CeO_2$, etc.) deposited thereon. Therefore, in order to form such a multi-layered buffer thin film, deposition apparatuses, such as a sputterer, an evaporator and an electron beam laser, are sequentially operated depending on the number of components ($Y_2O_3$, YSZ, and $CeO_2$) constituting the multi-layered buffer thin film.

The multi-layered buffer thin film formed above is problematic in that processes of depositing a thin film are conducted several times and deposition conditions must be differently set for each of the processes, and thus productivity is decreased and costs are increased in the manufacturing of a superconducting sheet, thereby decreasing economic efficiency.

Further, the multi-layered buffer thin film is problematic in that the difference in the physical properties between buffer thin films causes various problems, and it cannot properly serve as a buffer layer between a substrate and a superconductor because it is difficult to control the processes of depositing a buffer layer, which are conducted to set all of the characteristics of a superconducting sheet.

SUMMARY OF THE INVENTION

Accordingly, the present invention has been made keeping in mind the above problems occurring in the prior art, and an object of the present invention is to provide a gradient thin film in which the thin film is formed by simultaneously depositing different materials using various deposition apparatuses, so that the composition thereof is continuously changed depending on the thickness thereof, with the result that the physical properties of a thin film are easily controlled and the number of deposition processes is decreased, and thus processing time and manufacturing cost are decreased, thereby realizing economic efficiency.

In order to accomplish the above object, the present invention provides a gradient thin film, formed on a substrate by simultaneously depositing different materials on the substrate using a plurality of thin film deposition apparatuses provided in a vacuum chamber, wherein the gradient thin film is formed such that the composition thereof is continuously changed depending on the thickness thereof by deposition control plates provided in the path through which the different materials move to the substrate.

Further, the gradient thin film may be a buffer layer of a superconducting sheet.

Further, the buffer layer may include a $Y_xZ_{1-x}O$ layer (Yttrium Zirconium Oxide layer), in which x is decreased with the increase of the thickness of the thin film, and thus Y and Zr components are continuously decreased and increased with the increase of the thickness thereof. Further, the buffer layer may be formed of $Y_xZ_{1-x}O/Y_2O_3$, and a gradient layer, in which Y and Zr components are continuously decreased and increased with the increase of the thickness of the thin film, may be formed between the $Y_xZ_{1-x}O$ layer and the $Y_2O_3$ layer. Further, the buffer layer may be formed of $CeO_2/Y_xZ_{1-x}O/Y_2O_3$, a gradient layer, in which Ce, and Y and Zr components are continuously decreased and increased with the increase of the thickness of the thin film, may be formed between the $CeO_2$ layer and the $Y_xZ_{1-x}O$ layer, and a gradient layer, in which Y and Zr components are continuously decreased and increased with the increase of the thickness thereof, may be formed between the $Y_xZ_{1-x}O$ layer and the $Y_2O_3$ layer.

Further, the buffer layer may include a $C_xZ_{1-x}O$ layer (Cerium Zirconium Oxide layer), in which x is decreased with the increase of the thickness of the thin film, and thus Ce and Zr components are continuously decreased and increased with the increase of the thickness thereof. Further, the buffer layer may be formed of $C_xZ_{1-x}O/CeO_2$, and a gradient layer, in which Ce and Zr components are continuously decreased and increased with the increase of the thickness of the thin film, may be formed between the $C_xZ_{1-x}O$ layer and the $CeO_2$ layer. Furthermore, the buffer layer may be formed of $CeO_2/C_xZ_{1-x}O/CeO_2$, a gradient layer, in which Ce and Zr components are continuously decreased and increased with the increase of the thickness of the thin film, may be formed between the $CeO_2$ layer and the $C_xZ_{1-x}O$ layer, and a gradient layer, in which Ce and Zr components are continuously decreased and increased with the increase of the thickness thereof, may be formed between the $C_xZ_{1-x}O$ layer and the $CeO_2$ layer.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Figure 1:
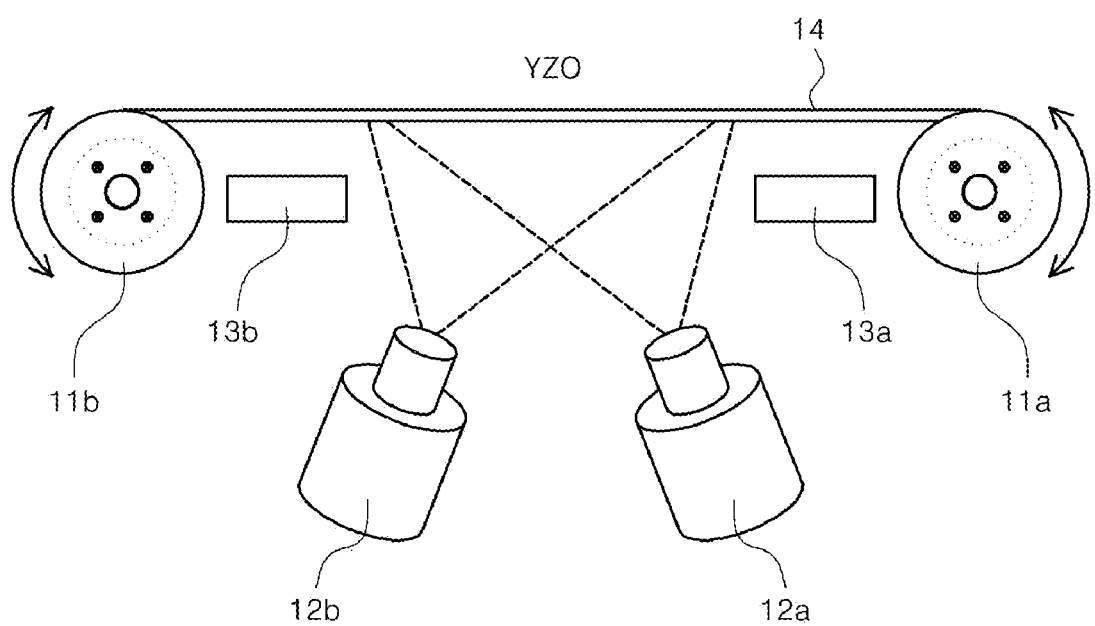
FIG. 1 is a schematic view showing a deposition system for depositing a gradient thin film.

Hereinafter, a preferred embodiment of the present invention will be described in detail with reference to the attached drawings.

The gradient thin film according to the present invention is a thin film, the composition of which is changed depending on the thickness of the thin film formed on a substrate. That is, when the thin film is composed of different materials, the amount of any one of the materials is increased or decreased with the increase of the thickness thereof.

In particular, when such a gradient thin film is formed into a buffer layer of a superconducting sheet, the action and effect thereof become excellent. Generally, a buffer layer of a superconducting sheet is composed of different materials, and thus various processes for forming each layer composed of each of the materials must be conducted. Therefore, the buffer layer, formed in such a manner, is multi-layered, so that there are differences in physical properties between the layers and between the buffer layer and the substrate, with the result that it is difficult to control the characteristics of a superconducting sheet, thereby deteriorating the physical properties of the superconducting sheet.

That is, when the gradient thin film of the present invention is formed into a buffer layer of a superconducting sheet, the overall composition of such a multi-layered buffer layer is continuously changed, and thus the multi-layered buffer layer appears to have the form of a single buffer layer. For this reason, it is easy to realize the characteristics of a superconducting sheet, thereby improving the physical properties of the superconducting sheet.

Such a buffer layer, the composition of which is continuously changed depending on the thickness of a thin film, is formed using a physical vapor deposition system. Generally, the physical vapor deposition system includes a sputterer, an evaporator, and an electron beam laser.

In order to deposit different materials in a vacuum chamber of the deposition system, deposition materials are charged in sputtering guns, or different targets are charged in respective evaporating crucibles in vacuum chambers of the evaporator and electron beam laser, and then the sputtering guns, evaporating crucibles, or electron beam holders are operated, thus depositing different deposition materials on a substrate located opposite thereto.

In this case, the sputtering guns, evaporating crucibles, or electron beam holders are provided depending on the number of different targets, and they are simultaneously operated, thus simultaneously depositing different deposition materials on a substrate.

Here, in order to control deposition areas, deposition control plates, which are composed of flexible materials, are provided in the path through which the different materials move to the substrate. The deposition control plates serve to set various deposition areas in which buffer deposition materials, composed of new components and combinations thereof, are formed in predetermined areas on the substrate by controlling atomic velocity or molecular velocity as well as by determining the deposition areas.

Generally, in a process of manufacturing a superconducting sheet, a substrate is supplied from one reel to another reel and is simultaneously wound therearound using a reel-to-reel type substrate supply method. In the direction in which the substrate is moved, a region in which the components of a buffer layer to be formed are combined with each other is formed by controlling the deposition distance of a thin film, thus manufacturing a superconducting sheet having a buffering layer composed of the same or different materials according to the movement of the substrate.

That is, buffering layers, composed of various materials, are formed on a substrate by simultaneously operating the sputtering guns, evaporating crucibles and electron beam holders and controlling deposition area. These buffer layers are formed into a gradient layer in which the composition of each of the buffer layers is continuously changed.

Therefore, the gradient layer is configured such that the composition of each of the buffer layers is continuously changed. That is, unlike a conventional multi-layered buffer layer in which the difference in properties between interfaces is great, the gradient layer serves as a single thin film because its composition is changed depending on the thickness thereof. For this reason, it is easy to control the characteristics of a superconducting sheet.

According to an embodiment of the present invention, as a superconducting single buffer layer including a gradient layer, a superconducting single buffer layer including an $Y_xZ_{1-x}O$ layer (Yttrium Zirconium Oxide layer) or a $C_xZ_{1-x}O$ layer (Cerium Zirconium Oxide layer) is provided. Here, through the control of deposition areas in each of the deposition apparatuses, x is not constant, but is decreased with the increase of the thickness of the thin film, and thus Y and Zr components or Ce and Zr components are continuously decreased and increased with the increase of the thickness thereof.

The $Y_xZ_{1-x}O$ or $C_xZ_{1-x}O$ is completely different from $Y_2O_3$, YSZ (Yttrium Stabilized Zirconium) or $CeO_2$, which is used as a conventional thin film material for a buffer layer. Therefore, since the composition of the $Y_xZ_{1-x}O$ layer or $C_xZ_{1-x}O$ layer is continuously formed, interfaces between different materials scarcely exist, or the difference in properties across the interfaces is minimized, so that a so-called "single buffer layer" is formed, thereby improving the characteristics of a superconducting sheet.

In a single buffer layer of a superconducting sheet including the $Y_xZ_{1-x}O$ layer (different from an YSZ layer) or a $C_xZ_{1-x}O$ layer (different from a CSZ layer), a Y target, Zr target and Ce target are formed along the direction in which a substrate is supplied, deposition control plates are located at predetermined positions, and thus buffer layers including Zr, Y and Ce can be formed while the $Y_xZ_{1-x}O$ layer or $C_xZ_{1-x}O$ layer is formed, thereby forming a gradient layer, in which the components of the buffer layers are continuously increased and decreased, between the buffer layers.

Here, a single buffer layer having no interface may be formed by continuously changing the composition of the entire buffer layer through the proper control of deposition area, or a buffer layer composed of Zr, Y and Ce may be formed on and beneath a substrate, and a gradient layer, such as a $Y_xZ_{1-x}O$ layer or a $C_xZ_{1-x}O$ layer, may be formed between the buffer layers, so that the difference in physical properties occurring in a conventional multi-layered buffer layer is minimized or a single buffer layer having no interface is formed throughout the entire thickness thereof, with the result that it is easy to control the characteristics of a superconducting sheet, thereby realizing a high-quality superconducting sheet.

As a single buffer layer including the $Y_xZ_{1-x}O$ layer, the single buffer layer may be formed of $Y_xZ_{1-x}O/Y_2O_3$, and a gradient layer, in which the Y component is continuously decreased (the Zr component is increased) in the upward direction from the $Y_2O_3$ layer and the Zr component is continuously increased (the Y component is decreased) in the downward direction from the $Y_xZ_{1-x}O$ layer depending on the thickness of the thin film, is formed between the $Y_xZ_{1-x}O$ layer and the $Y_2O_3$ layer. This gradient layer, if necessary, may be selectively formed to have a suitable thickness through the proper control of deposition area.

Further, as a single buffer layer including the $Y_xZ_{1-x}O$ layer, the single buffer layer may be formed of $CeO_2/Y_xZ_{1-x}O/Y_2O_3$. Here, a gradient layer, in which the Ce component is continuously increased (the Y and Zr components are decreased) in the upward direction from the $Y_xZ_{1-x}O$ layer and the Ce component is continuously decreased (the Y and Zr components are increased) in the downward direction from the $CeO_2$ layer depending on the thickness of the thin film, is formed between the $CeO_2$ layer and the $Y_xZ_{1-x}O$ layer. Further, a gradient layer, in which the Y component is continuously decreased (the Zr component is increased) in the upward direction from the $Y_2O_3$ layer and the Zr component is continuously decreased (the Y component is increased) in the downward direction from the $Y_xZ_{1-x}O$ layer depending on the thickness of the thin film, is formed between the $Y_xZ_{1-x}O$ layer and the $Y_2O_3$ layer.

Further, in a single buffer layer including a $C_xZ_{1-x}O$ layer, a Zr target and a Ce target are vertically or horizontally formed along the direction in which a substrate is supplied, and deposition control plates are located at predetermined positions, and thus buffer layers including Zr and Ce can be formed while the $C_xZ_{1-x}O$ layer is formed, thereby forming a gradient layer, in which the components of the buffer layers are continuously increased and decreased, between the buffer layers. This gradient layer, if necessary, may be selectively formed to have a suitable thickness through the proper control of deposition area.

As a single buffer layer including the $C_xZ_{1-x}O$ layer, the single buffer layer may be formed of $C_xZ_{1-x}O/CeO_2$, and a gradient layer, in which the Zr component is continuously increased in the upward direction from the $CeO_2$ layer and the Zr component is continuously decreased in the downward direction from the $C_xZ_{1-x}O$ layer depending on the thickness of the thin film, is formed between the $C_xZ_{1-x}O$ layer and the $CeO_2$ layer.

Further, as a single buffer layer including the $C_xZ_{1-x}O$ layer, the single buffer layer may be formed of $CeO_2/C_xZ_{1-x}O/CeO_2$. Here, a gradient layer, in which the Zr component is continuously increased in the downward direction from the upper $CeO_2$ layer and the Zr component is continuously decreased in the upward direction from the $C_xZ_{1-x}O$ layer depending on the thickness of the thin film, is formed between the upper $CeO_2$ layer and the $C_xZ_{1-x}O$ layer. Further, a gradient layer, in which the Zr component is continuously increased in the upward direction from the lower $CeO_2$ layer and the Zr component is continuously decreased in the downward direction from the $C_xZ_{1-x}O$ layer depending on the thickness of the thin film, is formed between the $C_xZ_{1-x}O$ layer and the lower $CeO_2$ layer.

Hereinafter, the physical properties of a single buffer layer, formed of $Y_xZ_{1-x}O$, according to a preferred embodiment of the present invention and the characteristics of a superconducting sheet including the single buffer layer will be described. The single buffer layer, formed of $Y_xZ_{1-x}O$, was formed under the deposition conditions given in Table 1.

TABLE 1

| Deposition temperature (° C.) | 750 |
| Chamber standard pressure | $10^{-7}$ Torr |
| Reaction gas pressure (Ar) | 4 mTorr |
| Reaction gas pressure ($H_2O$) | 1 mTorr |
| Deposition rate (Å/sec) | 3 |
| Tape moving speed (m/h) | 4 |

First, in order to form a superconducting thin film, formed of $YBCO/Y_xZ_{1-x}O/NiW$, including the single buffer layer, as shown in FIG. 1, a reel-to-reel system was provided. In the reel-to-reel system, reels 11a and 11b for supplying and winding a substrate 14 are disposed at both sides in a vacuum chamber, and two or more deposition apparatuses, for example, sputtering guns, are disposed opposite the reels 11a and 11b, and thus different materials are simultaneously deposited on the substrate 14.

Further, as shown in FIG. 1, as the sputtering guns, a sputtering gun 12b for Y and a sputtering gun 12a for Zr are disposed opposite respective reels 11a and 11b, and deposition control plates 13b and 13a are properly disposed in respective paths through which Y and Zr components move to the substrate 14, thus controlling the deposition area of the substrate and the thickness of a gradient layer. As the substrate 14 moves from left to right, a gradient layer containing a large amount of Zr is formed on the substrate 14, and, with the increase in the thickness of the gradient layer, finally, the gradient layer is formed into a buffer layer in the state in which the Zr component is increased and the Y component is decreased.

Figure 2A:
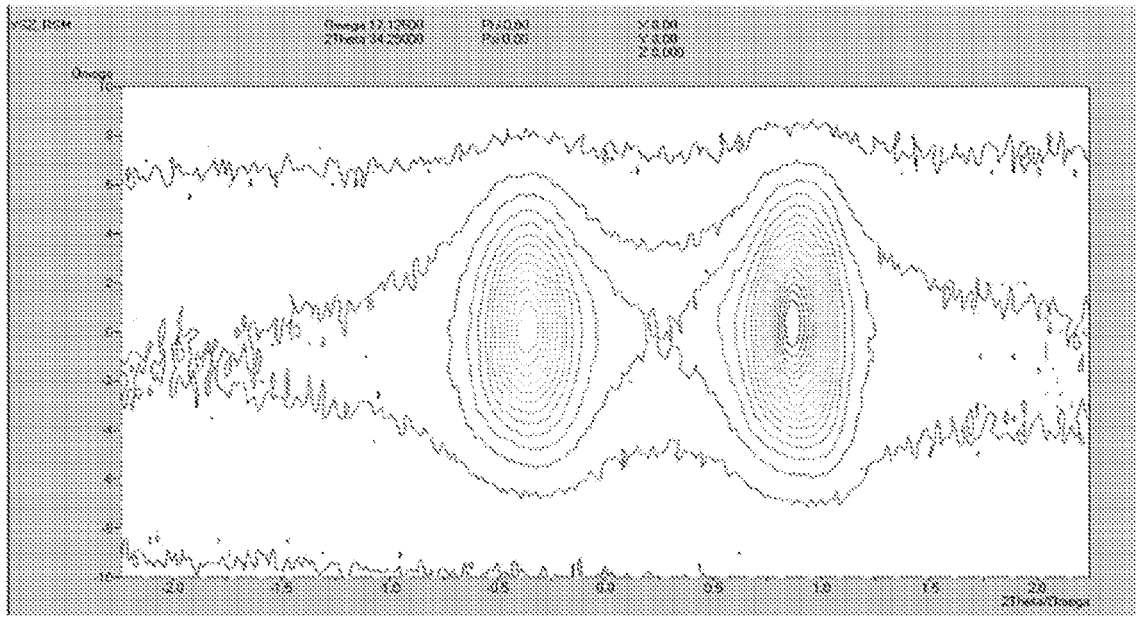
FIG. 2 is views and a graph showing the HR-XRD-RSM data of a superconducting sheet formed of $YBCO/Y_xZ_{1-x}O/NiW$ according to an embodiment of the present invention.
Figure 2B:
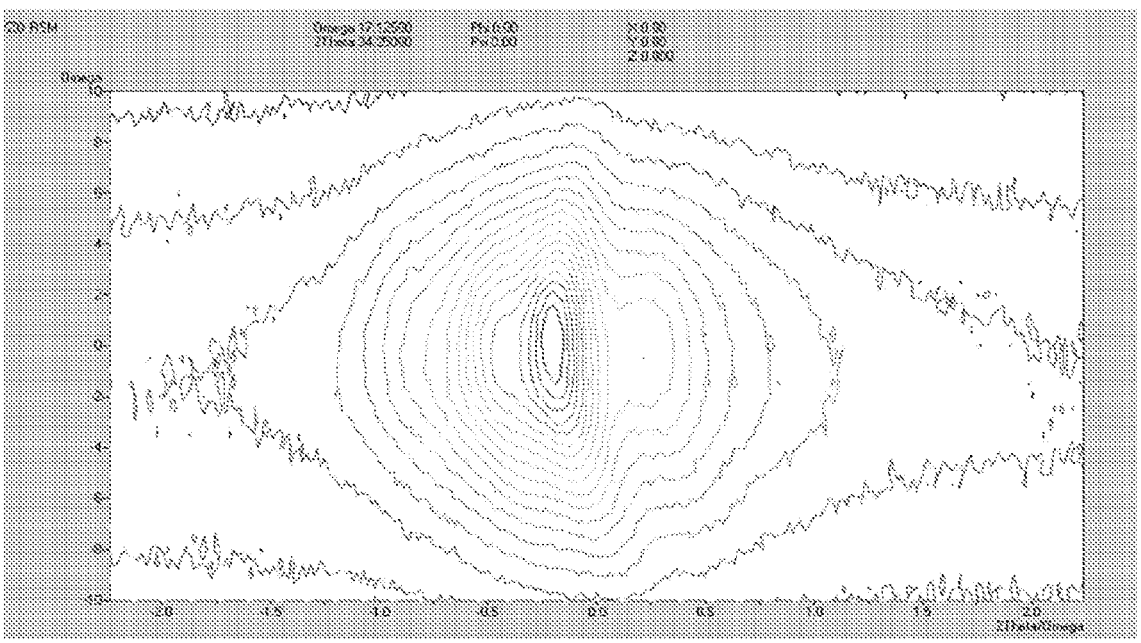
Figure 2C:
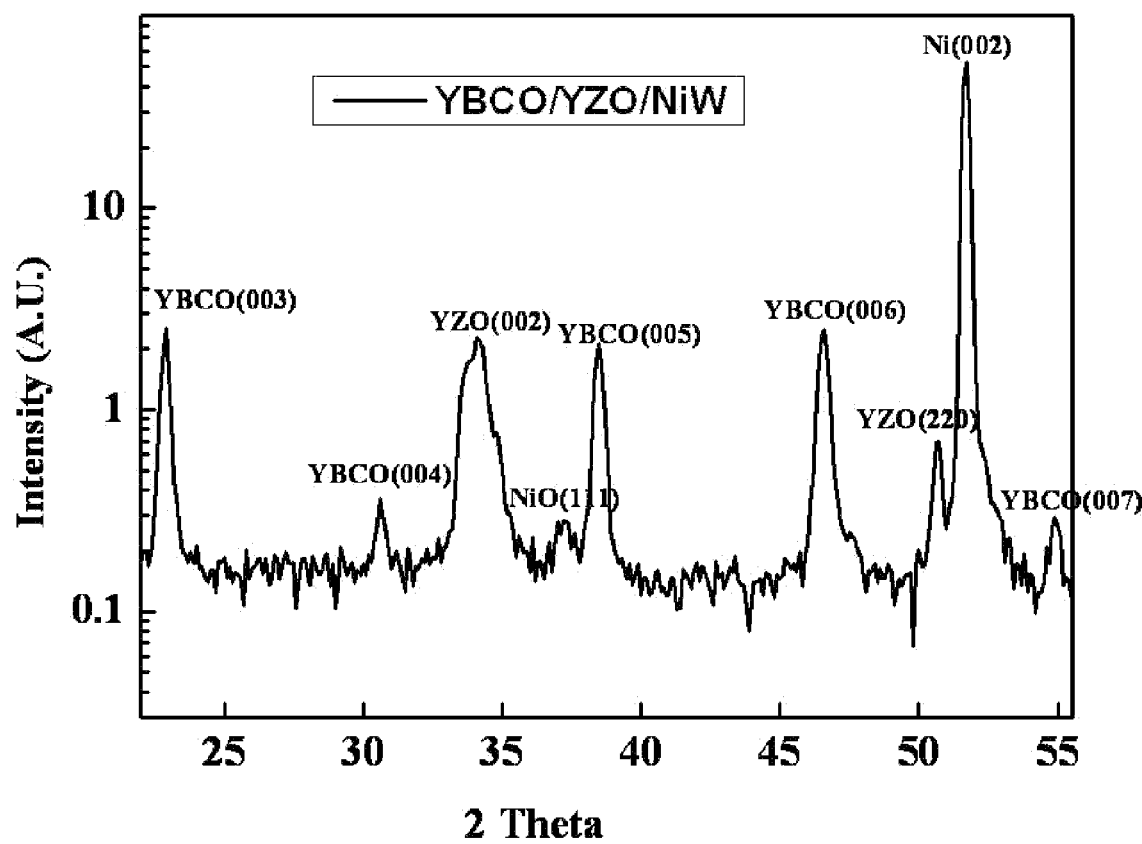

FIG. 2 is views and a graph showing the HR-XRD-RSM (High-Resolution Triple Axis X-Ray Diffraction-RSM) data of a superconducting sheet, formed of $YBCO/Y_xZ_{1-x}O/NiW$, including a single buffer layer according to an embodiment of the present invention. From FIG. 2, it can be seen that a novel thin film having completely different XRD patterns from those of a conventional YSZ thin film is formed. Further, it can be seen that an $Y_xZ_{1-x}O$ layer is epitaxially grown, and this fact means that the $Y_xZ_{1-x}O$ layer is grown while a cube texture is maintained. Furthermore, it can be seen that the lattice constant of the $Y_xZ_{1-x}O$ layer is continuously changed depending on the thickness thereof, and this fact suggests that the lattice constant thereof is changed depending on the composition ratio of $Y_xZ_{1-x}O$, that is, x.

Figure 3:
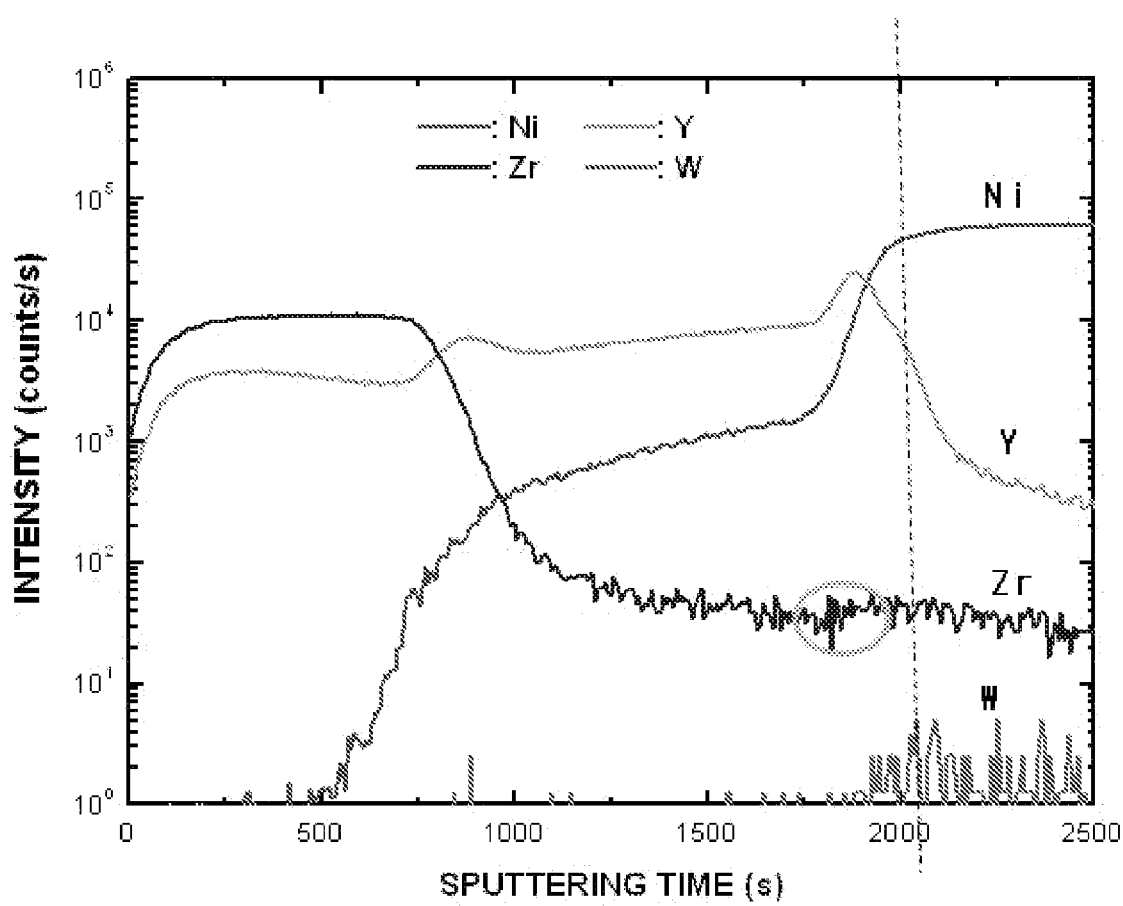
FIG. 3 is a graph showing the SIMS data of a thin film including a single $Y_xZ_{1-x}O$ buffer layer according to an embodiment of the present invention.

FIG. 3 is a graph showing the SIMS (Secondary Ion Mass Spectrometry) data of a thin film including a single $Y_xZ_{1-x}O$ buffer layer according to an embodiment of the present invention. From FIG. 3, it can be seen that the $Y_xZ_{1-x}O$ layer, which is a buffer layer of a superconducting sheet, serves as a satisfactory barrier for preventing the diffusion of the elements constituting a substrate. Further, it can be seen that the right side of the $Y_xZ_{1-x}O$ layer corresponds to an interface between an NiW substrate and an $Y_xZ_{1-x}O$ layer, and that the relative ratio of Y and Zr is continuously changed as the $Y_xZ_{1-x}O$ layer becomes more distant from the interface.

Figure 4:
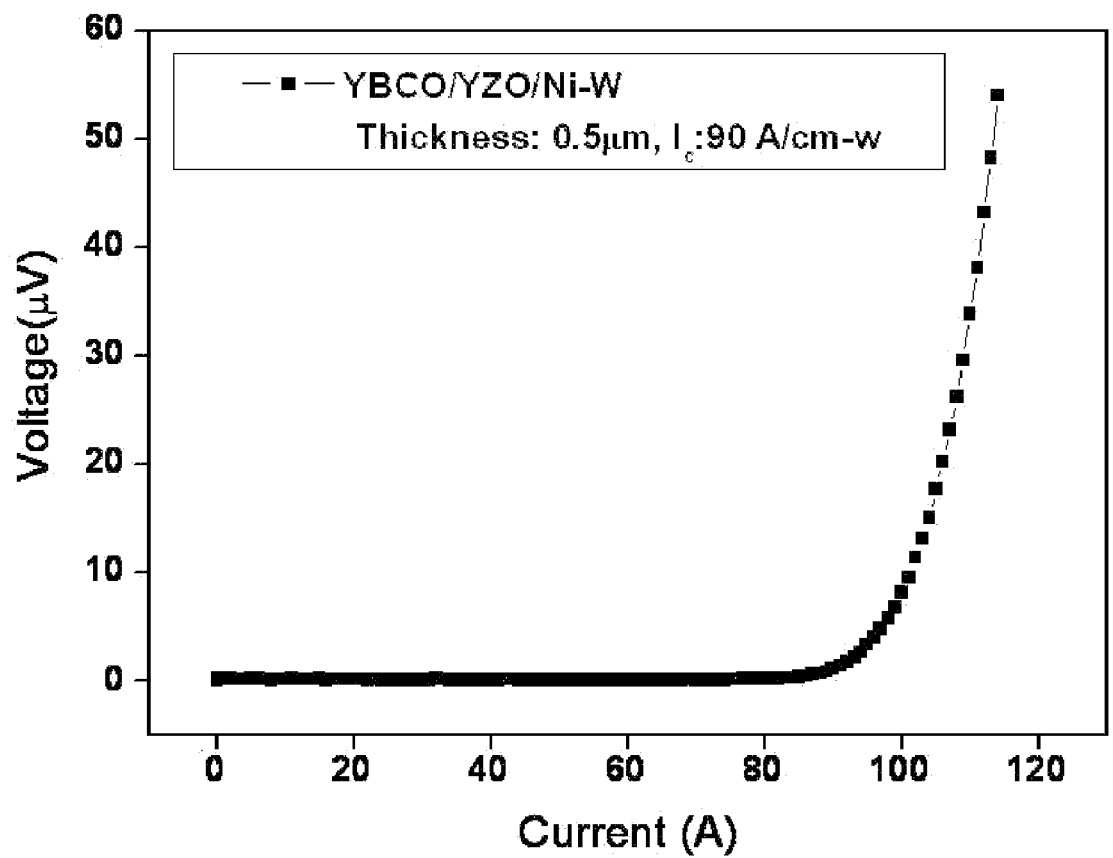
FIG. 4 is a graph showing the critical current characteristics of a superconducting sheet formed of $YBCO/Y_xZ_{1-x}O/NiW$ according to an embodiment of the present invention.
Figure 5:
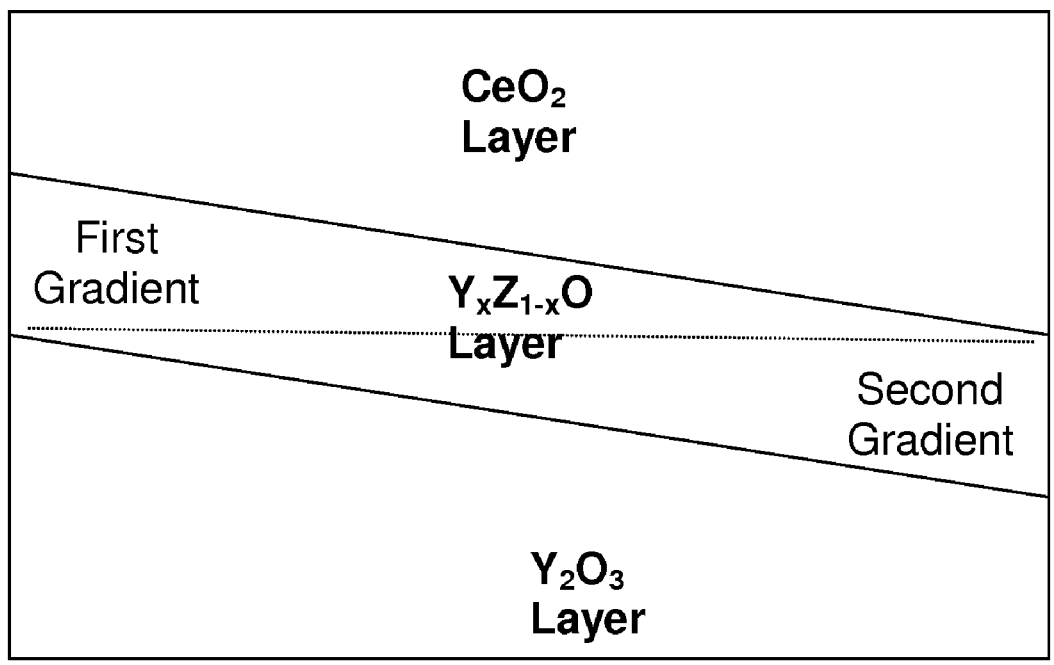
FIG. 5 schematically represents an embodiment of the present invention.

FIG. 4 is a graph showing the critical current characteristics of a superconducting sheet formed of $YBCO/Y_xZ_{1-x}O/NiW$ according to an embodiment of the present invention. From FIG. 4, it can be seen that the $YBCO/Y_xZ_{1-x}O/NiW$ layer sufficiently functions as a buffer layer. The reason why small values appear in the graph is assumed to be because the thickness of a thin film of the superconducting sheet is thin.

As described above, the present invention provides a gradient thin film in which the thin film is formed by simultaneously depositing different materials using various deposition apparatuses, so that the composition thereof is continuously changed depending on the thickness thereof, with the result that the physical properties of a thin film are easily controlled and the number of deposition processes is decreased, and thus processing time and manufacturing costs are decreased, thereby securing efficiency.

Further, the present invention provides a high-quality economical buffer layer for a superconducting sheet, formed using the gradient thin film, by which a process for manufacturing a superconducting sheet is generally simplified, and in which the composition of the buffer layer, composed of different materials, is continuously changed depending on the thickness thereof to form a single buffer layer, and thus the physical properties of the superconducting sheet, manufactured using the buffer layer can be easily controlled.

Furthermore, the present invention provides a single buffer layer of a superconducting sheet, including $Y_xZ_{1-x}O$ layer (Yttrium Zirconium Oxide layer), $C_xZ_{1-x}O$ layer (Cerium Zirconium Oxide layer) or the like, which is completely different from a conventional buffer layer composed of YSZ (Yttrium Stabilized Zirconium), by which a superconducting sheet can be manufactured at low cost in a short time through a single deposition process, and which can serves as a satisfactory buffer layer of a superconducting sheet.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A buffer layer of a superconducting sheet formed as a gradient thin film, said buffer layer comprising $CeO_2/Y_xZr_{1-x}O/Y_2O_3$, in which x is decreased with an increase of the thickness of the thin film, with buffer layer including a first gradient layer between the $CeO_2$ layer and the $Y_xZr_{1-x}O$ layer, in which Ce, and Y and Zr components are continuously decreased and increased with an increase of the thickness of the thin film, and a second gradient layer between the $Y_xZr_{1-x}O$ layer and the $Y_2O_3$ layer in which Y and Zr components are continuously decreased and increased with an increase of the thickness thereof.

2. A buffer layer of a superconducting sheet formed as a gradient thin film, said buffer layer comprising $CeO_2/C_xZr_{1-x}O/CeO_2$, in which x is decreased with an increase of the thickness of the thin film, with buffer layer including a first gradient layer between the $CeO_2$ layer and the $C_xZr_{1-x}O$ layer, in which Ce and Zr components are continuously decreased and increased with an increase of the thickness of the thin film, and a second gradient layer between the $C_xZr_{1-x}O$ layer and the $CeO_2$ layer, in which Ce and Zr components are continuously decreased and increased with an increase of the thickness thereof.

* * * * *